US005629502A

United States Patent [19]

Nakano

[11] Patent Number: 5,629,502

[45] Date of Patent: May 13, 1997

[54] SPEAKER APPARATUS

[75] Inventor: Yasuhide Nakano, Tokyo, Japan

[73] Assignee: Sony Corporation, Tokyo, Japan

[21] Appl. No.: 393,627

[22] Filed: Feb. 24, 1995

[30] Foreign Application Priority Data

Mar. 2, 1994 [JP] Japan .................................... 6-032154
Jul. 29, 1994 [JP] Japan .................................... 6-178480

[51] Int. Cl.[6] ........................................................ H05K 5/00

[52] U.S. Cl. ........................... 181/156; 181/145; 181/199

[58] Field of Search .................................... 181/156, 199, 181/144, 145, 148; 381/154, 159

[56] References Cited

U.S. PATENT DOCUMENTS 4,875,546 10/1989 Krnan .................................. 181/156 X
5,010,977 4/1991 Furukawa et al. .................. 181/156 X
5,025,885 6/1991 Froeschle ............................... 181/156

*Primary Examiner*—Khanh Dang
*Attorney, Agent, or Firm*—Jay H. Maioli

[57] ABSTRACT

A speaker apparatus includes a cabinet divided by a partition plate into a front compartment and a rear compartment, a speaker unit mounted on the partition plate so that the sound radiating direction is towards said front compartment, an internal passive radiator mounted on the partition plate, and a duct formed on an outer wall section of the front compartment for extending in the same direction as the sound radiating direction of the speaker unit. The speaker unit and the internal passive radiator mounted on the partition plate dividing the cabinet into a front compartment and a rear compartment render the rear compartment into a hermetically sealed box and constitute a resonance circuit. The sound is radiated via a duct formed on the outer wall section of the front compartment.

10 Claims, 16 Drawing Sheets

SPEAKER APPARATUS

FIELD OF THE INVENTION

This invention relates to a speaker apparatus and, more particularly, to a speaker apparatus particularly suitable for reproduction of lower frequency sounds.

BACKGROUND OF THE INVENTION

A general description of a commonly known speaker apparatus is shown in FIG. 1. In this type of speaker apparatus, there is provided a cabinet 1 which has an interior area which is divided by a partitioning plate 2 into a front chamber, or compartment, 3 and a rear chamber, or compartment, 4. A speaker unit 11 (speaker driver) is mounted on the partitioning plate 2 for improving low-range playback characteristics. The speaker unit 11 has a sound radiating direction which is substantially directed towards the front chamber 3, that is towards the front side of cabinet 1. There is an internal duct 101 which is mounted, or pierced, thru the partition plate 2 so as to extend from the front chamber 3 to the rear chamber 4. Duct 101 allows the passage, or communication, of sound waves between the front and rear chamber 3 and 4. The interaction between the speaker unit 11, front and rear chambers 3 and 4, and duct 101 is that of a resonance circuit. The internal duct 101 is bent at a mid portion to adapt itself to the depth of the front chamber 3. Front chamber 3 is adapted to communicate, or allow passage of sound, to outside the cabinet 1, in a forward direction (substantially the same direction as the sound radiating direction of the speaker unit 11) by an external duct 6 provided in a front plate 8 of the cabinet 1. The speaker unit 11 has a magnetic circuit 12 and a diaphragm 17. The external duct 6 is mounted within, or thru, an opening 5 which is formed in the front plate 8 of the cabinet 1.

FIG. 2 shows such a vibrating system comprised by such speaker unit in which a resistor $R_1$, an inductance $L_2$, compliances $C_2$, $C_3$ and $C_4$ are connected in series with a vibrating source to form a loop, an inductance $L_1$ provided by the inner duct 101 is connected in parallel with the resistance $R_1$, the inductance $L_2$ and the compliance $C_2$ have connected thereto an inductance $L_3$ provided by the external duct 6 that is connected in parallel with the compliance $C_4$.

With the above-described speaker apparatus, the air flows thru internal duct 101 at an elevated velocity between front chamber 3 and rear chamber 4. As a result of the high velocity passage of air thru the internal duct 101, a hissing sound is produced at or near the ends of the internal duct 101. This hissing sound is unwanted and acts generally to deteriorate the quality of the reproduced sound. As an example of specifically generated hissing sounds for a given cabinet, consider the following. If the outer dimensions of the cabinet are so set that its width, depth and height are 200 mm, 300 mm and 600 mm, respectively, the capacity of the front compartment 3 is 15000 $cm^3$ (15 liters), the capacity of the rear compartment 4 is 10000 $cm^3$ (10 liters), the diameter of a circular diaphragm 17 of the speaker unit 11 is 16 cm and the diameter and the overall length of the internal duct 101 are 60 mm and 260 mm, respectively, the hissing sound of 40 to 50 Hz is produced.

Further, with the speaker apparatus having such an internal duct 101, braking cannot be applied over the entire frequency range, such that, if a larger input signal is applied in succession to the speaker unit, the sound quality tends to be deteriorated. That is, suppression of the high-range standing waves and inhibition of distortion due to second and third harmonics cannot be achieved sufficiently.

SUMMARY OF THE INVENTION

In view of the foregoing, it is an object of the present invention to provide a speaker apparatus having a speaker unit and a resonance circuit mounted in a partitioning plate dividing the cabinet into a front compartment and a rear compartment, in which the hissing sound may be prevented from being produced and braking may be applied satisfactorily over a greater frequency range for improving the frequency response and the distortion factor.

In one embodiment of the present invention there is provided a speaker apparatus which includes a cabinet having an interior area which is divided into two compartments (a front compartment and a rear compartment), or chambers, by a partition plate (or baffle). A speaker unit, or driver, is mounted on, or thru, the partition plate so that the sound radiating direction of the speaker unit is toward, or into, the front compartment. An internal passive radiator is mounted on, or thru, the partition plate. A duct is formed in, or thru, an outer wall section of the cabinet so as to allow passage of air from the front compartment to outside the cabinet. The duct is aligned so that its length is substantially parallel to the sound radiating direction of the speaker unit. The internal passive radiator is mounted below the speaker unit and has a diaphragm which is no smaller in area than the diaphragm of the speaker unit. The duct is mounted thru the cabinet at a position which allows it to be substantially aligned with, or facing, the internal passive radiator. The speaker unit and the internal passive radiator mounted on the partition plate dividing the cabinet into a front compartment and a rear compartment are mounted so as to render the rear compartment into a hermetically sealed box. That is, the front and rear compartments are effectively sealed so as to inhibit the flow of air from one compartment to the other. Further, the components act as a resonance circuit. The sound is radiated via a duct formed on the outer wall section of the front compartment.

By positioning the duct to face the internal passive radiator as described, the playback sound efficiency is improved and flatter frequency characteristics may be realized.

In another embodiment of the present invention there is provided a speaker apparatus which includes a cabinet having an interior space which is divided by a partition plate into a front compartment and a rear compartment. A speaker unit is mounted on, or thru, the partition plate in such a way that the sound radiated from the speaker unit is directed toward, or into, the front compartment. An internal passive radiator is mounted on the partition plate, and an external passive radiator is mounted on, or thru, an outer wall section of the cabinet into the front compartment. The sound radiating direction of the external passive radiator is substantially the same as the sound radiating direction of the speaker unit. The external passive radiator has a diaphragm which is larger in area than the diaphragm of the internal passive radiator. The internal passive radiator has a diaphragm which is no smaller in area than the diaphragm of the speaker unit.

The speaker unit and the internal passive radiator mounted on the partition plate are constructed so as to render the rear compartment into a hermetically sealed box which constitute a resonance circuit. That is, the front and rear compartments are effectively sealed so as to inhibit the flow of air from one compartment to the other. The sound is radiated via the external passive radiator which is mounted on the outer wall section of the front compartment and which is also mounted so as to effectively maintain the front compartment as a hermetically sealed box.

In view of the above, the present invention allows for substantially consistent playback characteristics over a wide frequency range and at a high sound pressure level.

DETAILED DESCRIPTION OF THE INVENTION

Figure 1:
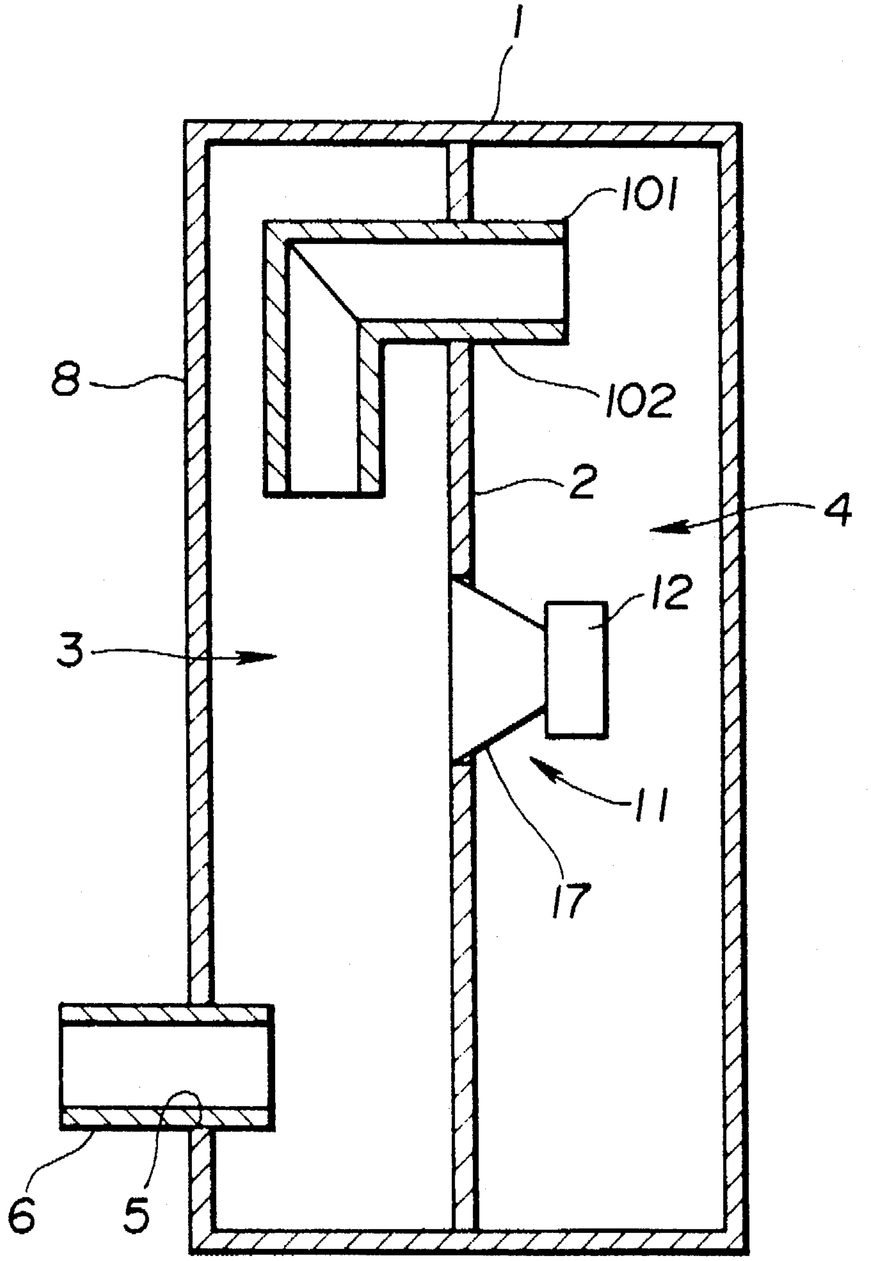
FIG.1 (PRIOR ART)
FIG. 1 is a cross-sectional side view showing a conventional speaker apparatus.
Figure 2:
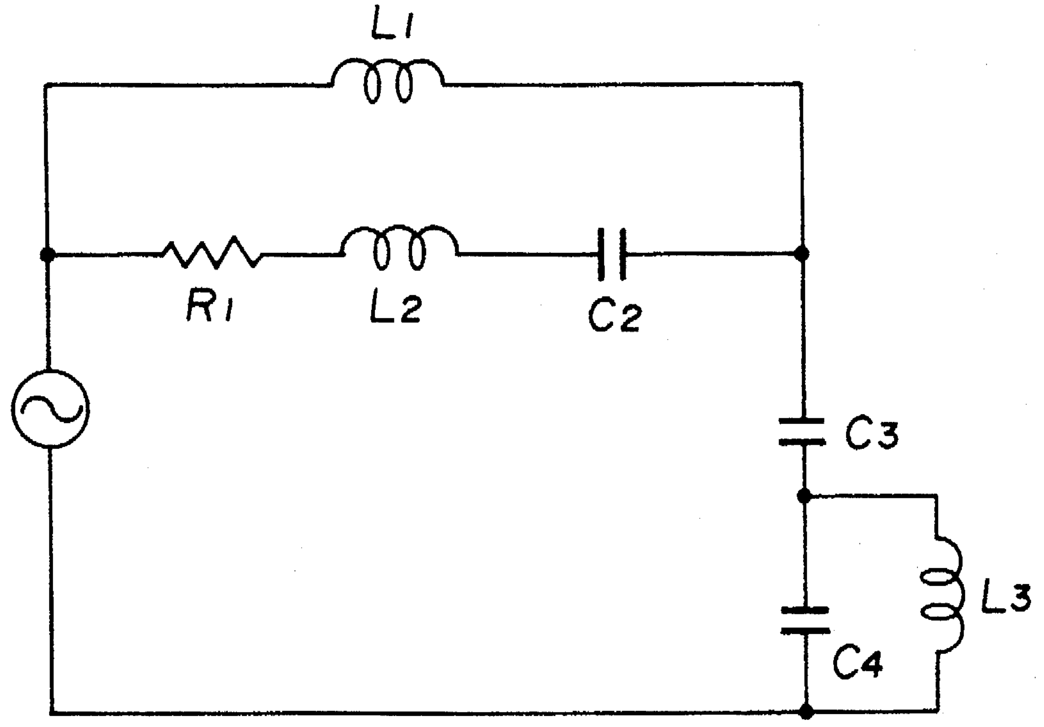
FIG. 2 is an electrical equivalent circuit of a vibrating system of the speaker apparatus shown in FIG. 1.
Figure 3:
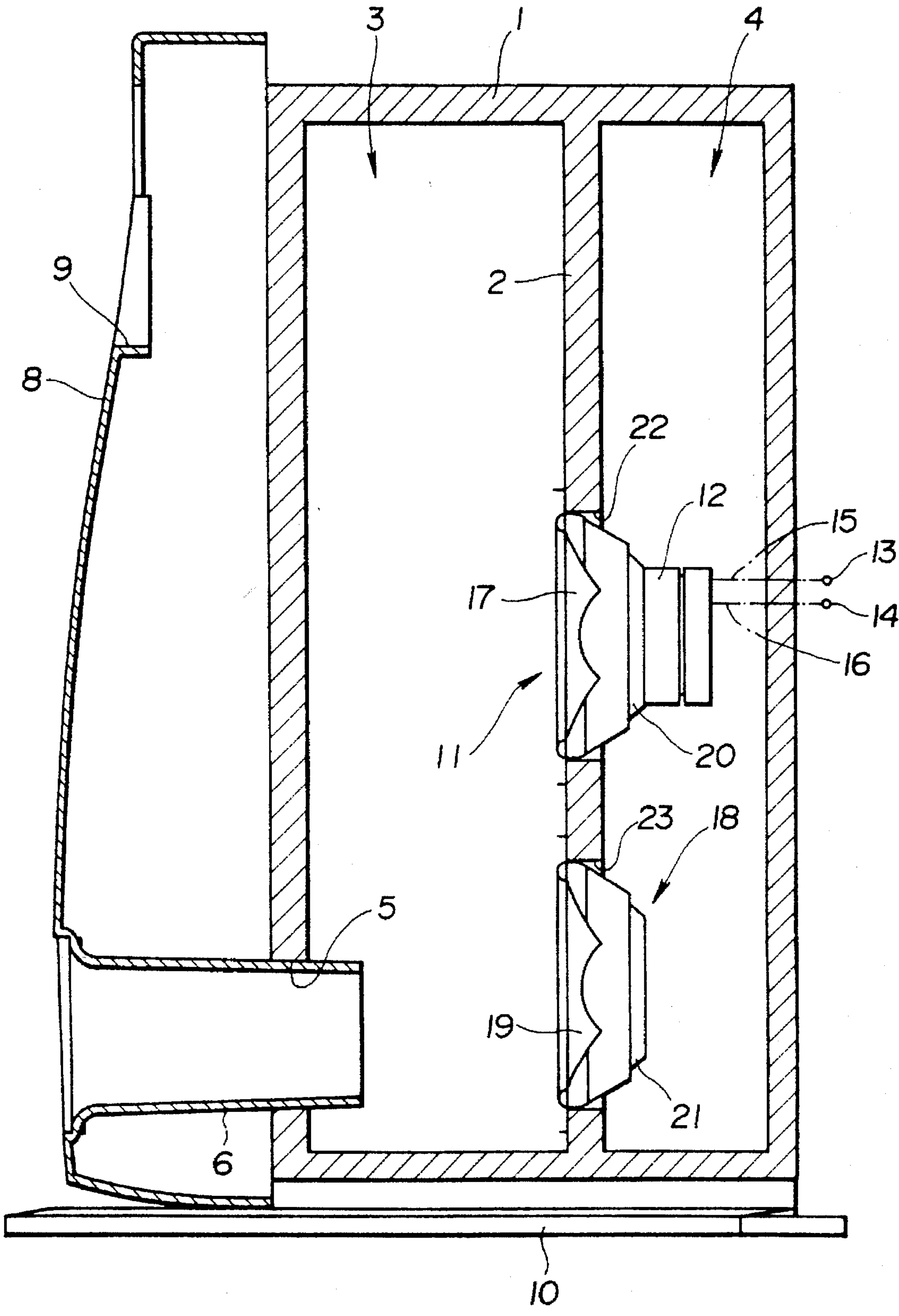
FIG. 3 is a cross-sectional side view showing a speaker apparatus according to the present invention.
Figure 4:
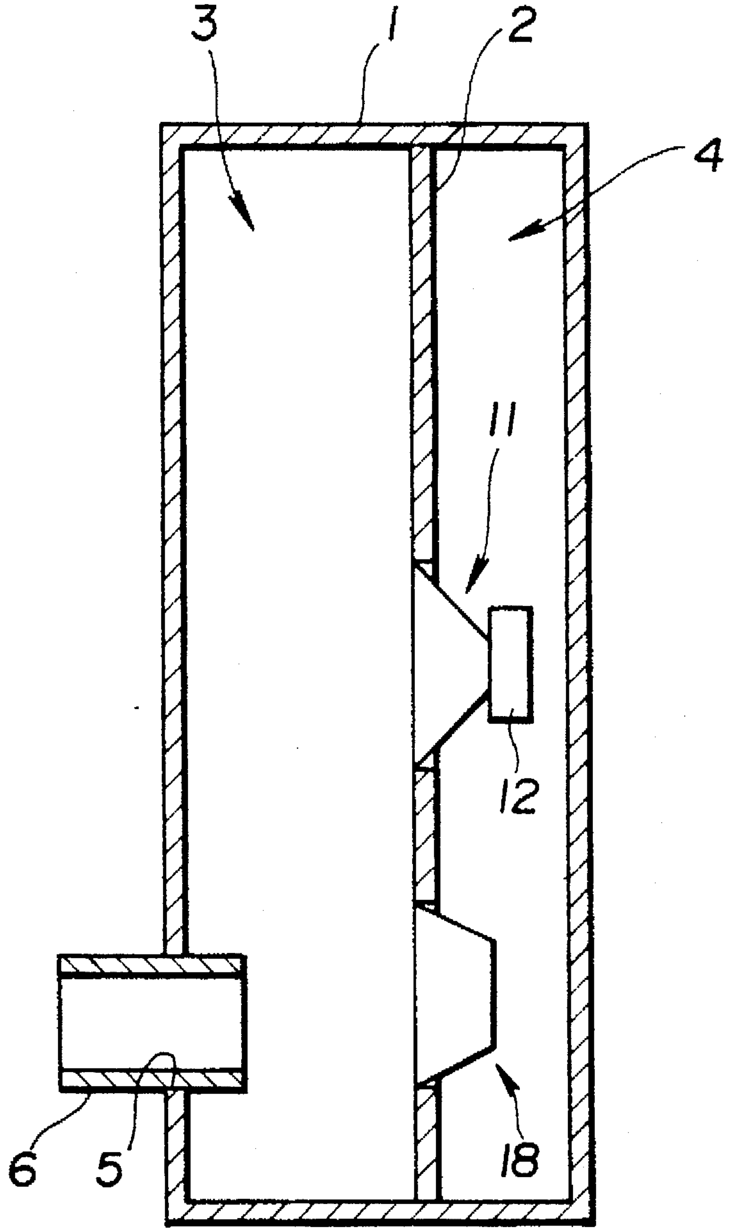
FIG. 4 is an additional cross-sectional side view showing an arrangement of the speaker apparatus of the present invention.

With reference to FIGS. 3, 4, 9 & 12, the present invention will be described as follows. The speaker apparatus according to the present invention has a cabinet 1 of, for example, wood, wood composite, metal, plastic, composite, carbon fiber, fiber glass or some other synthetic material. The cabinet 1 is constructed in the form of a hollow casing which defines an interior space. The interior space of the cabinet 1 is divided by a partitioning plate 2 into a front compartment 3 and a rear compartment 4.

A speaker unit 11 is mounted on the partitioning plate 2. The speaker unit 11 has a diaphragm 17 supported in a fore-and- aft direction by a frame 10, the rear end of which carries a magnetic circuit 12. The magnetic circuit 12 is made up of a yoke and a magnet supported by the frame 10 for defining a magnetic gap and a voice coil mounted on the diaphragm 17 within the magnetic gap. To the voice coil are connected a pair of input terminals 13, 14 via a pair of electrical lines 15, 16 drawn out of the cabinet 1. The speaker unit 11 has the outer peripheral portion of the frame 20 mounted on the inner peripheral portion of a through-hole 22 formed at a mid portion of the partitioning plate 2 for closing the through-hole 22. The speaker unit 11 is supported so that the sound is emitted towards the front compartment 3, that is towards the front side.

With the present speaker apparatus, an internal passive radiator 18 constituting a resonance circuit is mounted in the partition plate 2. The internal vibrator 18 has a diaphragm 19 supported by a frame 21 for vibration in the fore-and-aft direction. The internal passive radiator 18 has the outer peripheral edge of the frame 21 mounted on the inner periphery of a through-hole 23 formed in a lower portion of the partition plate 2 for closing the through-hole 23. The passive radiator 18 is supported so that its fore-and-aft direction is coincident with the vibrating direction of the diaphragm 19.

The front compartment 3 is kept in communication with the outside towards the front side of cabinet 1, that is, toward the direction as the sound radiating direction, via a cylindrically-shaped (or tubular) external duct 6 mounted on the front plate of the cabinet 1. The duct 6 is mounted by having a fit in a through-hole 5 formed in the front plate of the cabinet 1. The duct 6 is mounted towards the front side of the internal passive radiator 18. It will be recognized by those skilled in the art that duct 6 many be constructed in may forms other than a cylindrically shaped duct. Examples of other forms include rectangularly shaped ducts/ports or elliptically shaped ducts/ports.

The front surface of the cabinet 1 is mounted to a front cover 8 connected to the front end of the external duct 6. The front cover 8 is formed of a material having excellent moldability, such as synthetic resin. The upper portion of the front cover 8 has a through-hole 9 (or accommodation shelf) for mounting a device employed in conjunction with the present speaker apparatus, such as an amplifier or a display.

Figure 5:
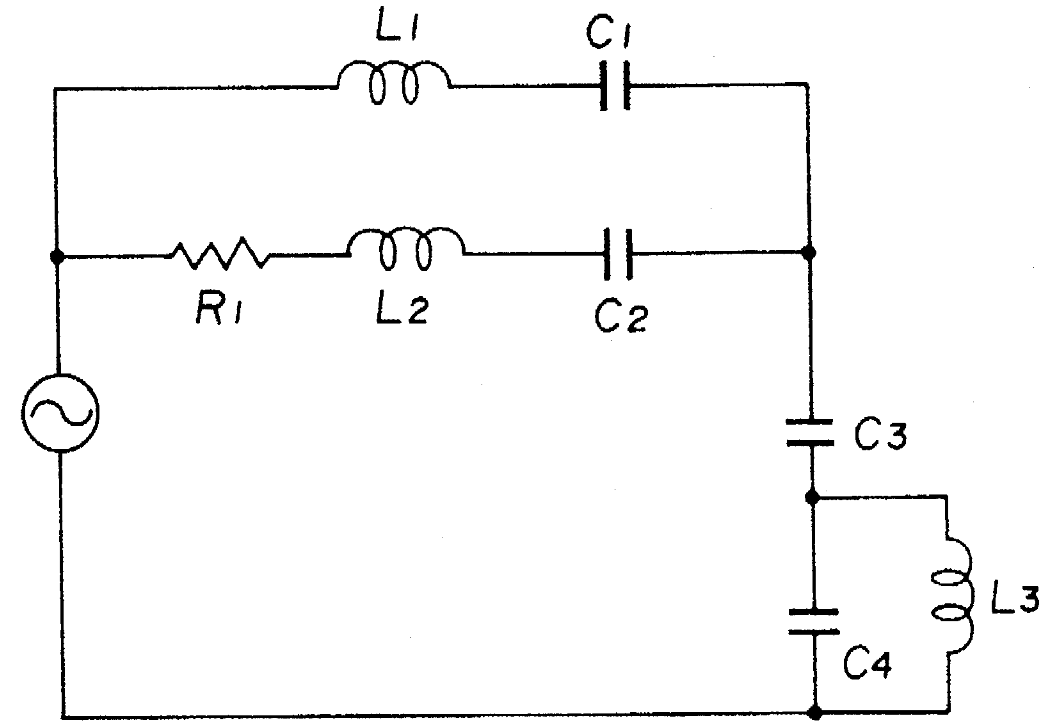
FIG. 5 is an equivalent electrical circuit of a vibrating system comprised by the speaker apparatus of the present invention.

The vibrating system in the present speaker apparatus is shown by an equivalent circuit of FIG. 5, in which a resistor $R_1$, an inductance $L_2$ and compliances $C_2$, $C_3$ and $C_4$ are connected in series with a vibrating source to form a loop, and in which a series connection of an inductance $L_1$ and a compliance $C_1$ provided by the internal passive radiator 18 is connected in parallel with the resistor $R_1$, inductance $L_2$ and the compliance $C_1$, with an inductance $L_3$ provided by the external duct 6 being connected in parallel with the compliance $C_4$.

With the present embodiment, in fabricating the speaker apparatus, the outer size of the cabinet is so set that its width, depth and height are 200 mm, 300 mm and 600 mm, respectively, the capacity of the front compartment 3 is 15000 $cm^3$ (15 liters), the capacity of the rear compartment 4 is 10000 $cm^3$ (10 liters), the diameter of a circular diaphragm 17 of the speaker unit 11 is 16 cm and the diameter of the internal passive radiator 18 is 16 cm. Duct 6 has internal diameter of 80 mm and a length of 200 mm.

Figure 6:
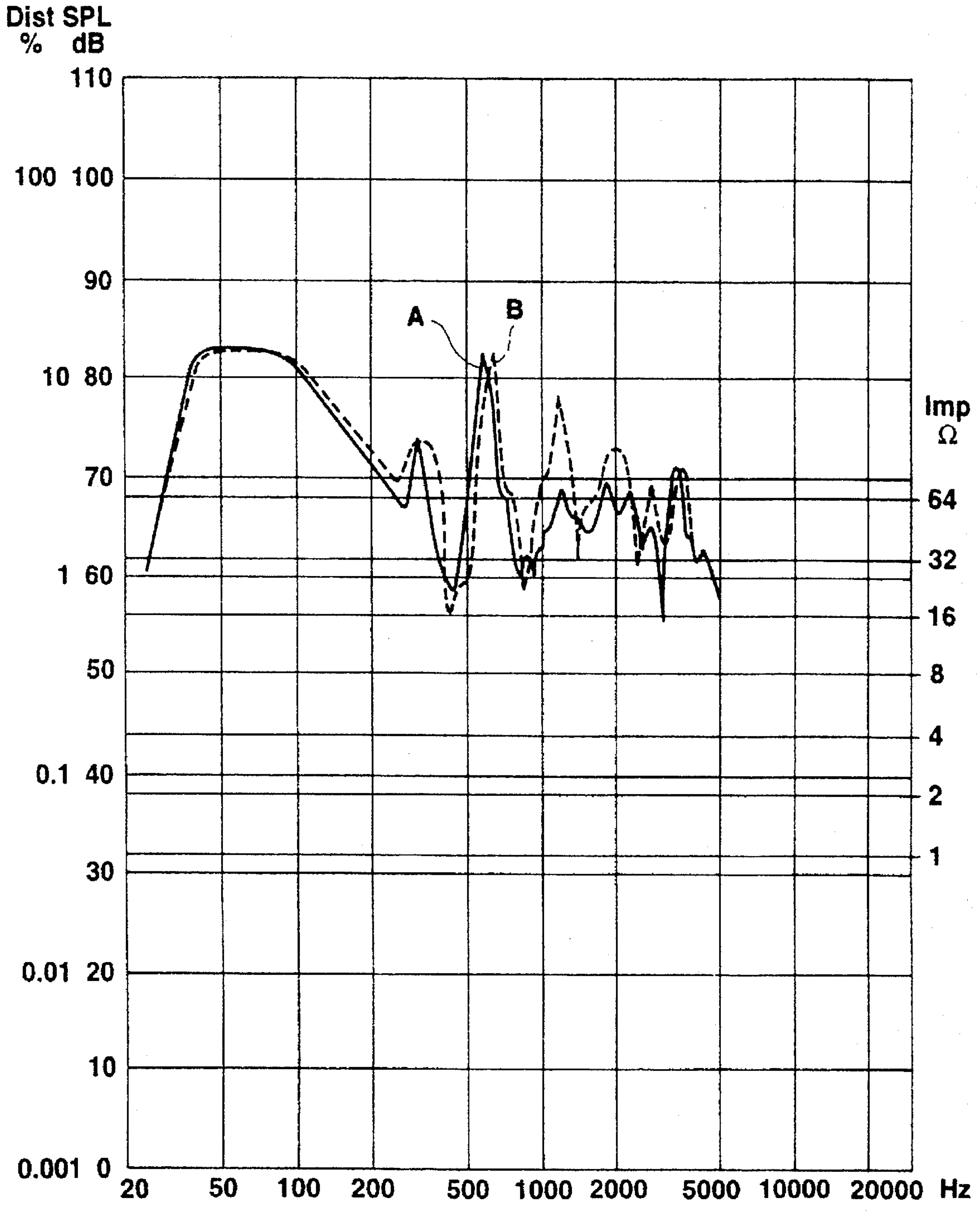
FIG. 6 is a graph showing the comparative frequency response A of the speaker apparatus shown in FIG. 3 and the frequency response of the conventional speaker apparatus shown in FIG. 1.

The frequency characteristics of sound reproduction by the present speaker apparatus is such that, as compared to the frequency characteristics of sound reproduction by a conventional speaker apparatus shown by a broken line B in FIG. 6, the standing wave in the high frequency range is prevented from being generated, as shown by a solid line A in FIG. 6. The conventional speaker apparatus has the internal duct 101, shown in FIG. 1.

Figure 7:
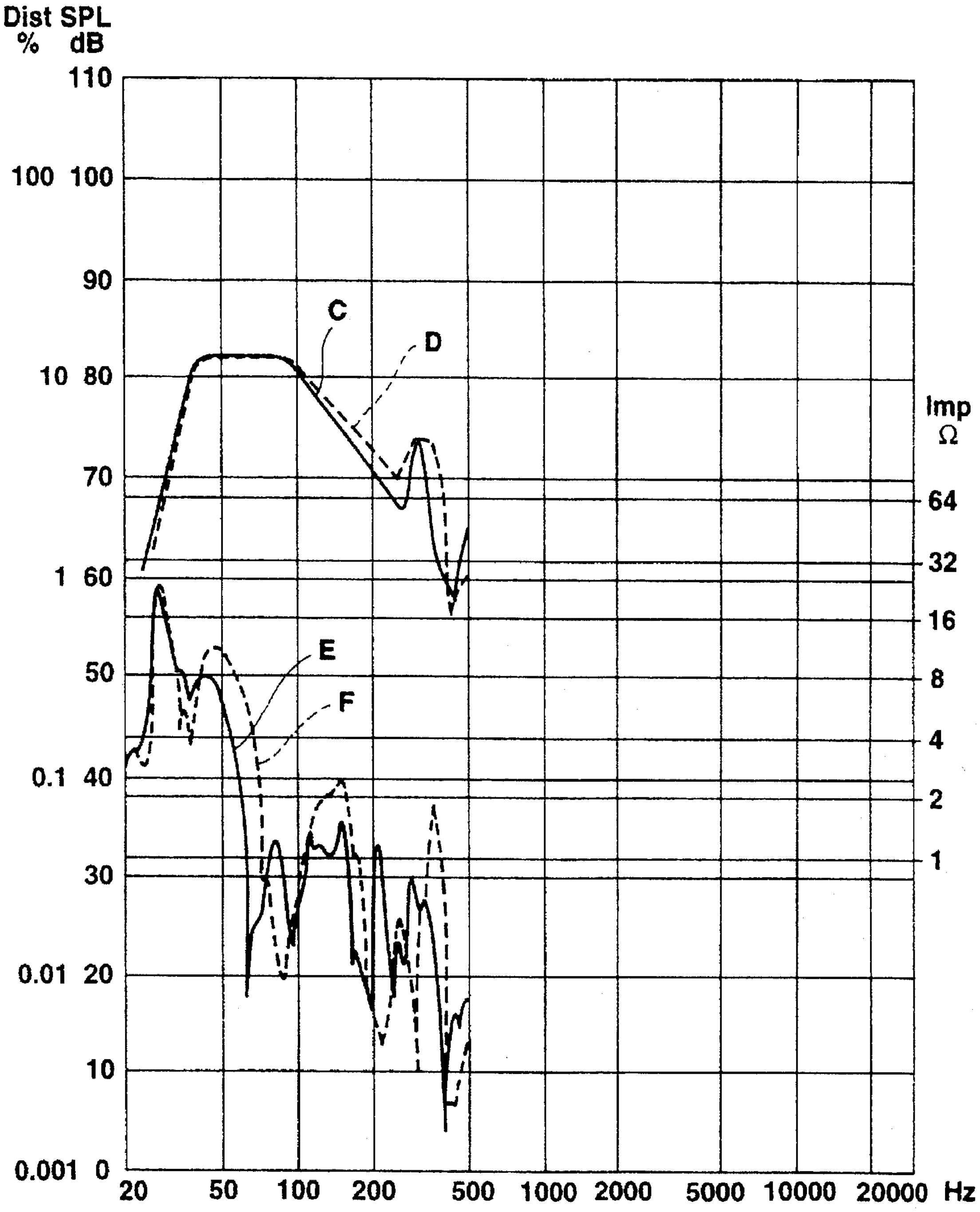
FIG. 7 is a graph showing the comparative distortion factor E by the second harmonics of the speaker apparatus of FIG. 3 and the distortion factor F by the second harmonics of the conventional speaker of FIG. 1.

On the other hand, the distortion factor by the second harmonics with the present speaker apparatus, as shown by a solid line E in FIG. 7, is improved over that by the second harmonics of the conventional speaker apparatus, shown by a broken line F in FIG. 7. In FIG. 7, a solid line C and a broken line D indicate part of frequency characteristics of the present speaker apparatus and part of the frequency characteristics of the above-described conventional speaker apparatus respectively.

Figure 8:
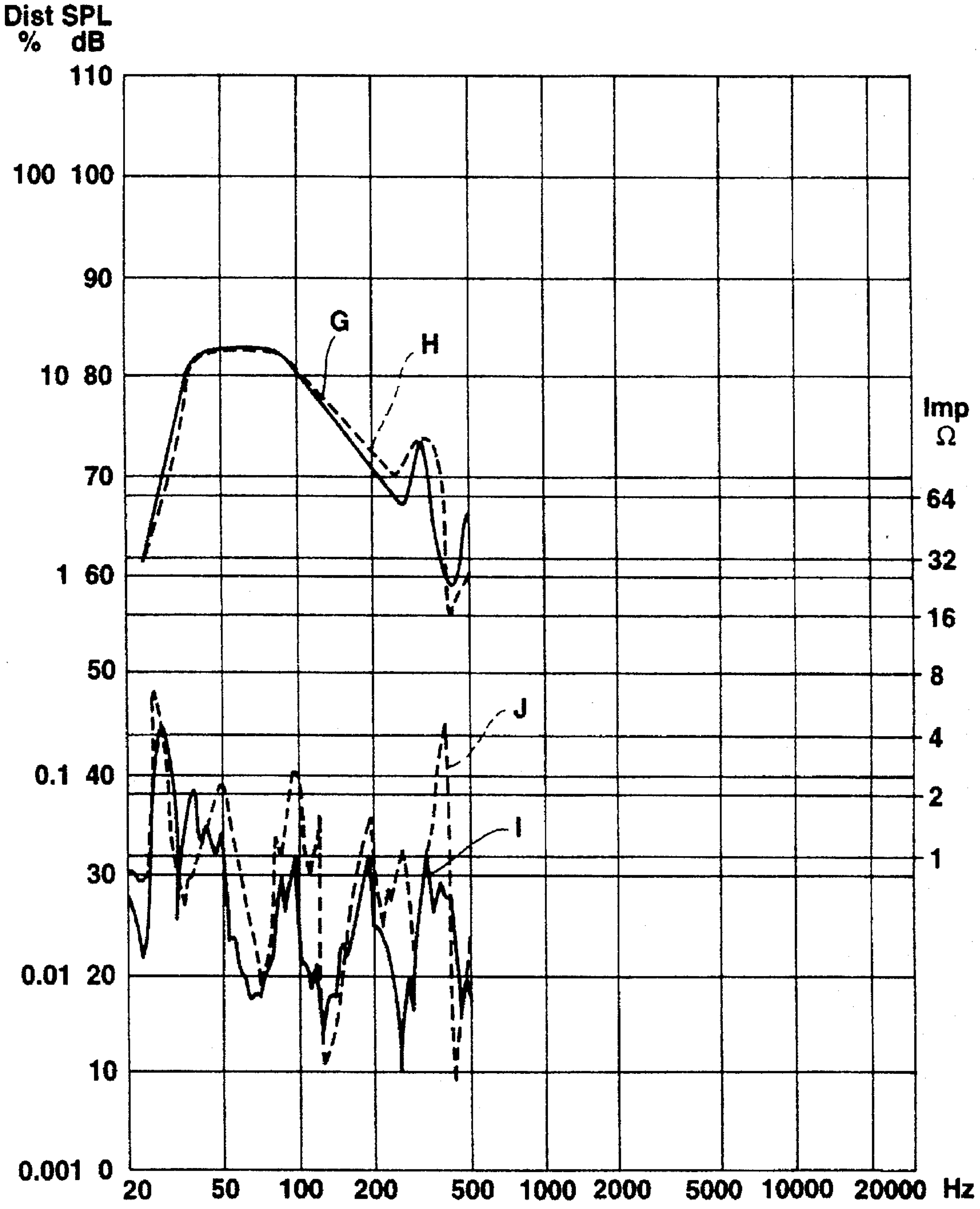
FIG. 8 is a graph for comparing the distortion factor E by the third harmonics of the speaker apparatus of FIG. 3 to the distortion factor F by the third harmonics of the conventional speaker.

In addition, the distortion factor by third harmonics with the present speaker apparatus is improved over that by the third harmonics shown by a broken line J in FIG. 8, as shown by a solid line I in FIG. 8, in which a solid line G and a broken line H indicate part of frequency characteristics of the present speaker apparatus and those of the previously described conventional speaker apparatus, respectively.

Figure 9:
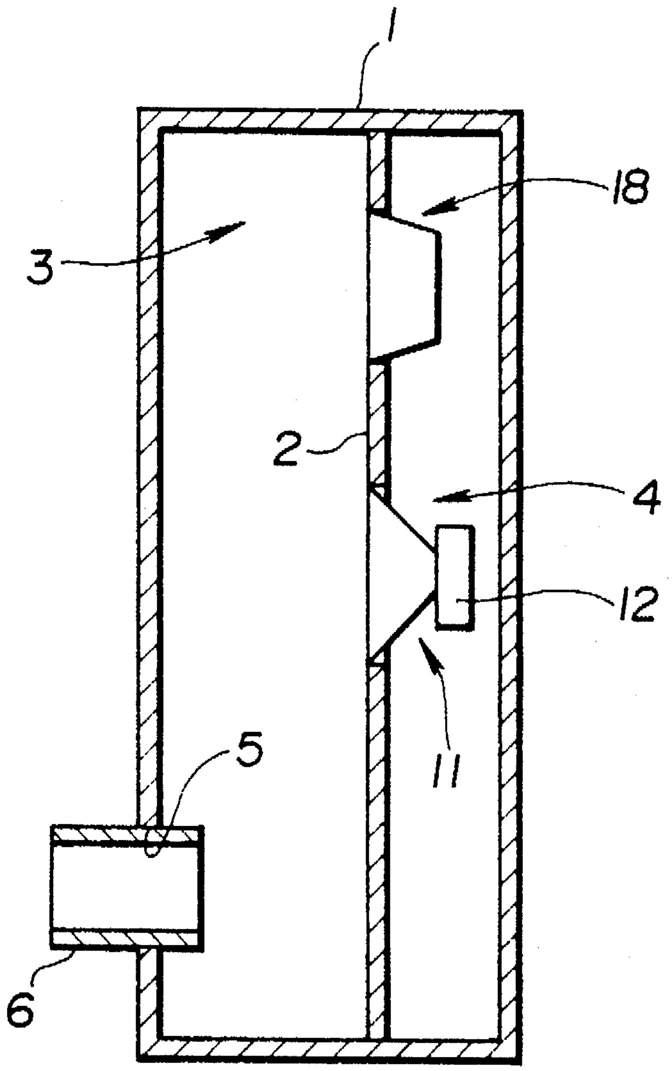
FIG. 9 is a longitudinal cross-sectional view showing the construction of a speaker apparatus having an internal passive radiator.
Figure 10:
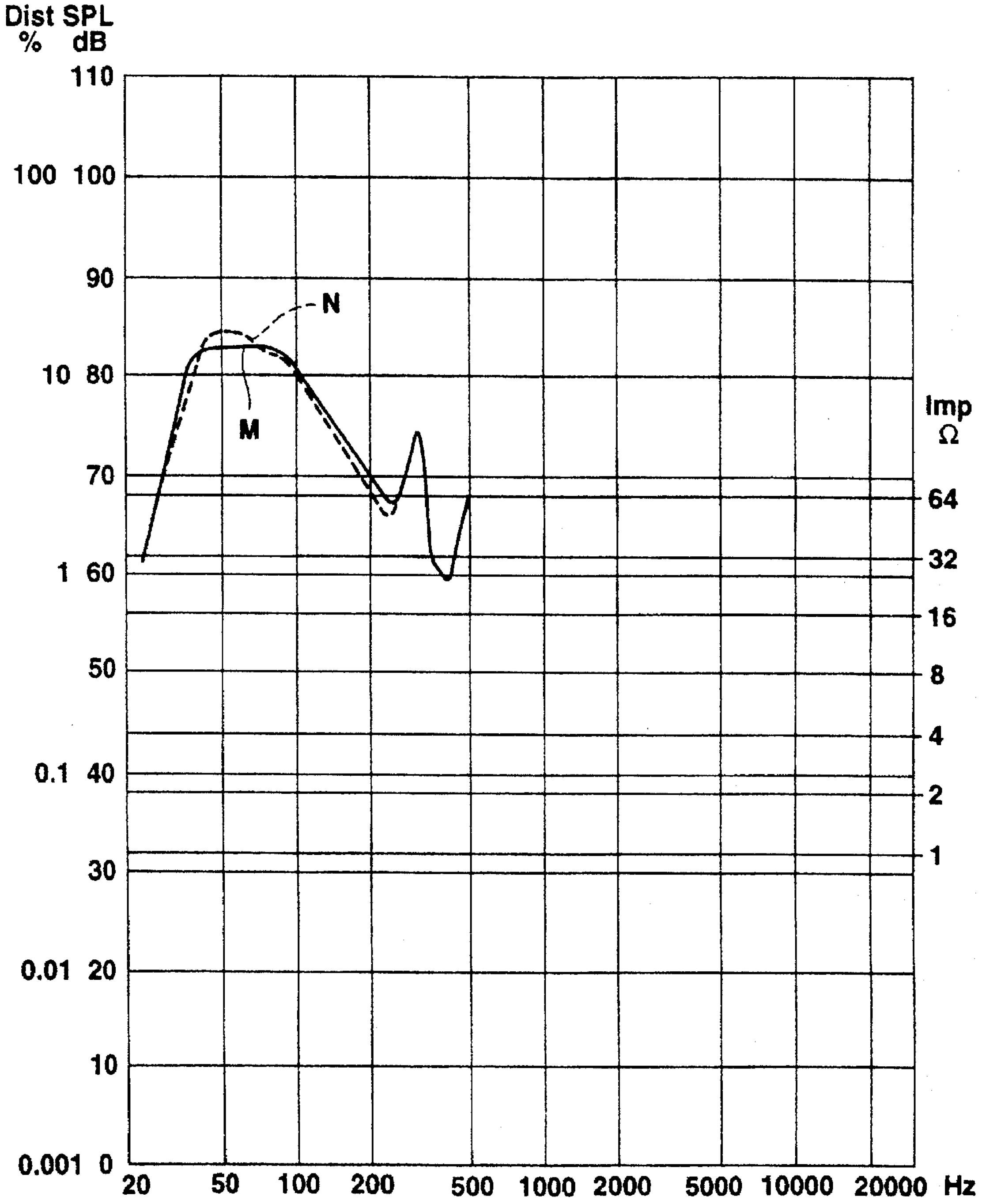
FIG. 10 is a chart for comparing speaker characteristics M of the speaker apparatus according to the present invention with frequency characteristics N of the speaker apparatus shown in FIG. 7.

As a comparative example, a speaker apparatus as shown in FIG. 9 was fabricated in which the partition plate 2 is mounted in a topsy-turvy position, with the internal passive radiator 18 being arranged above the speaker unit 11 and with the internal passive radiator 18 not facing the duct 6, for comparison as to frequency characteristics with the speaker apparatus of the present invention. The frequency characteristics of the present comparative apparatus of FIG. 9 shown by the broken line N in FIG. 10 lack flatness in the frequency characteristics of the speaker apparatus according to the present invention shown by a solid line M in FIG. 10. That is, the speaker apparatus according to the present invention has flatter frequency characteristics over a broad frequency range.

Figure 11:
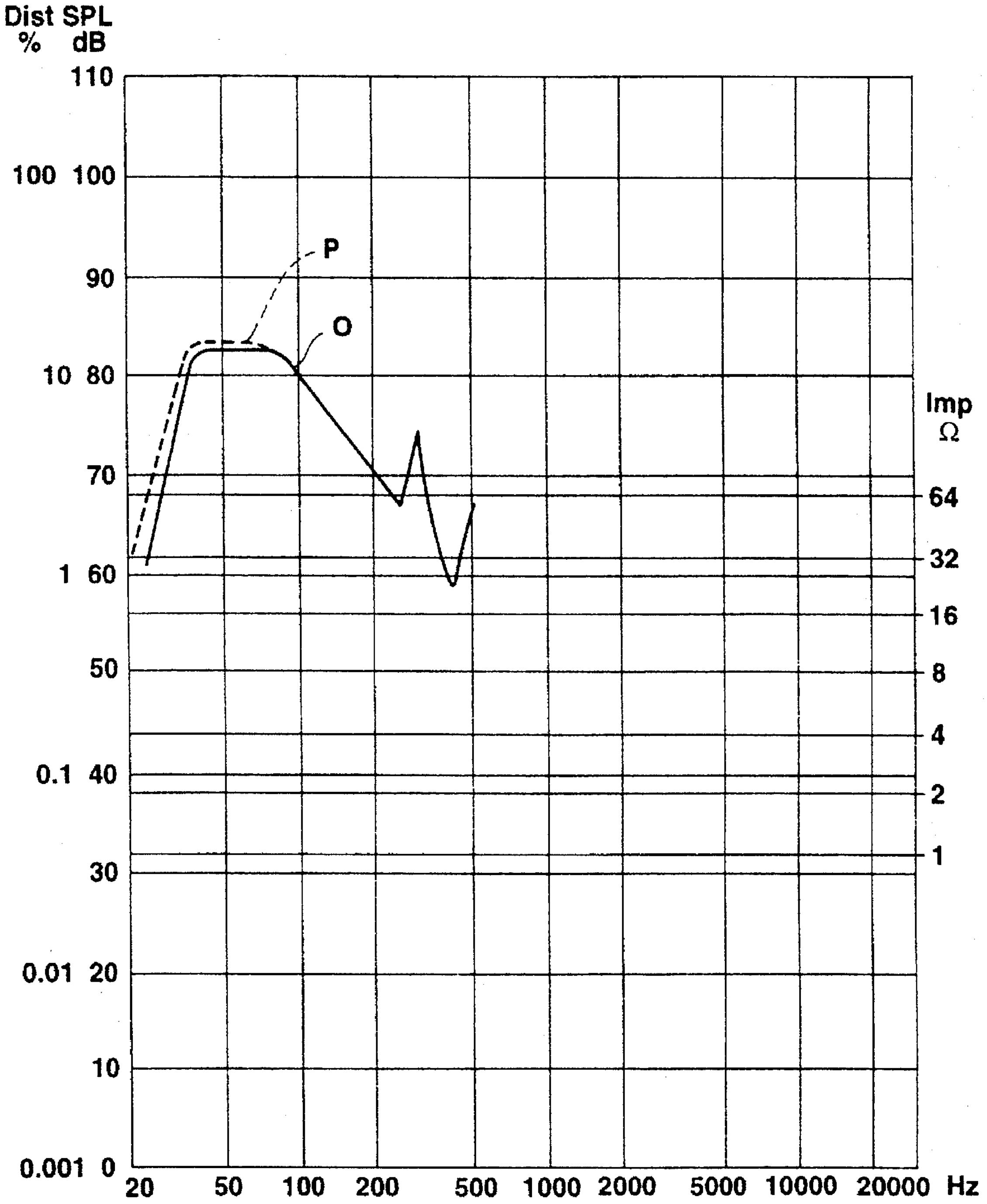
FIG. 11 is a graph showing the frequency characteristics O of the speaker apparatus according to the present invention as compared to the frequency characteristics P of a speaker apparatus having an elliptically-shaped internal passive radiator.

Next, as another embodiment of the speaker apparatus according to the present invention, a speaker apparatus was fabricated in which the internal passive radiator 18 is replaced by an elliptically-shaped diaphragm of 6 inch (15 cm) by 9 inch (23 cm) in size for comparison as to frequency characteristics with the speaker apparatus having the internal passive radiator 18 in turn having the circular diaphragm 19 which is 16 cm in diameter as described above. The frequency characteristics of this embodiment shown by the broken line P exhibit a higher sound pressure over the broad frequency range as compared to those of the previously described speaker apparatus shown by a solid line O in FIG. 11. The diaphragm 19 of the internal passive radiator 18 has a circular portion 16 cm in diameter and measuring approximately 804.2 $cm^2$ and an elliptical portion 6 inch×9 inch in size and measuring approximately 1083.8 $cm^2$.

Figure 12:
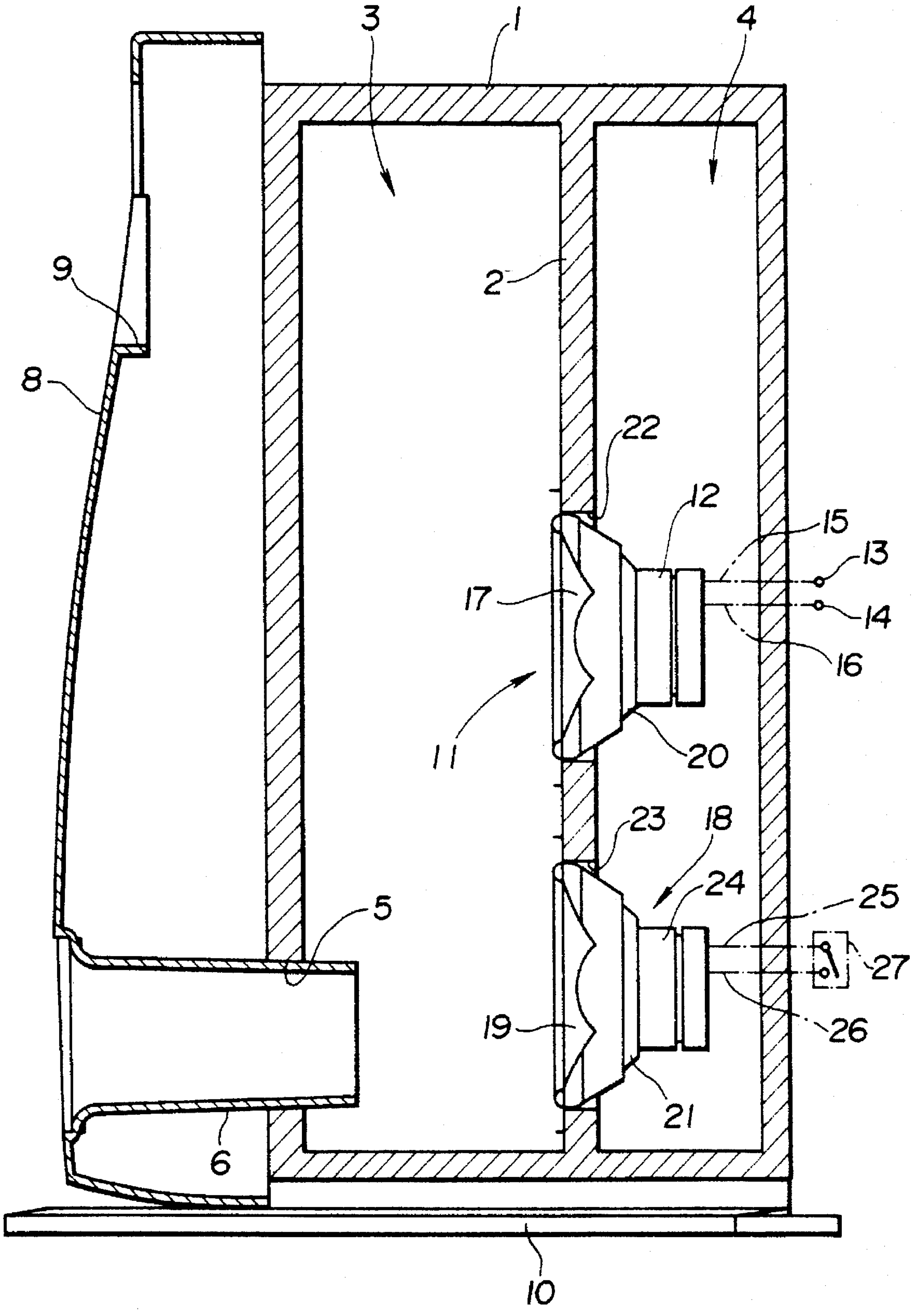
FIG. 12 is a longitudinal cross-sectional view, as viewed from the lateral side, showing another embodiment of the speaker apparatus according to the present invention, having a voice coil in the internal passive radiator, with the voice coil being cable of being opened and closed at either end.

The speaker apparatus according to the present invention may be constructed as shown in FIG. 12 to include an internal passive radiator 18, which is comprised of a magnetic circuit (voice coil) 24 mounted on, or attached to, a diaphragm 19 as shown in FIG. 12. The magnetic circuit 24 is configured similarly to the magnetic circuit 12 of the speaker unit 11 and includes a magnet and a yoke supported at a rear end of a frame 21 of the internal passive radiator 18. To the voice coil of the magnetic circuit 24 is connected a switch 27 via a pair of electrical lines 25, 26 led out of the cabinet 1. The switch plays the role of shorting or opening the voice coil lines 25, 26.

If the magnetic circuit 24 is provided on the internal passive radiator 18, the load on the diaphragm 19 of the internal passive radiator 18 can be variably controlled by the changeover operation of the switch 27. That is, if the switch 27 is closed, the load on the diaphragm 19 of the internal radiator 18 becomes larger than when the switch 27 remains open. Thus it is possible with the present speaker apparatus to used the switch 27 for changing the braking state for changing frequency characteristics of sound reproduction.

Figure 13:
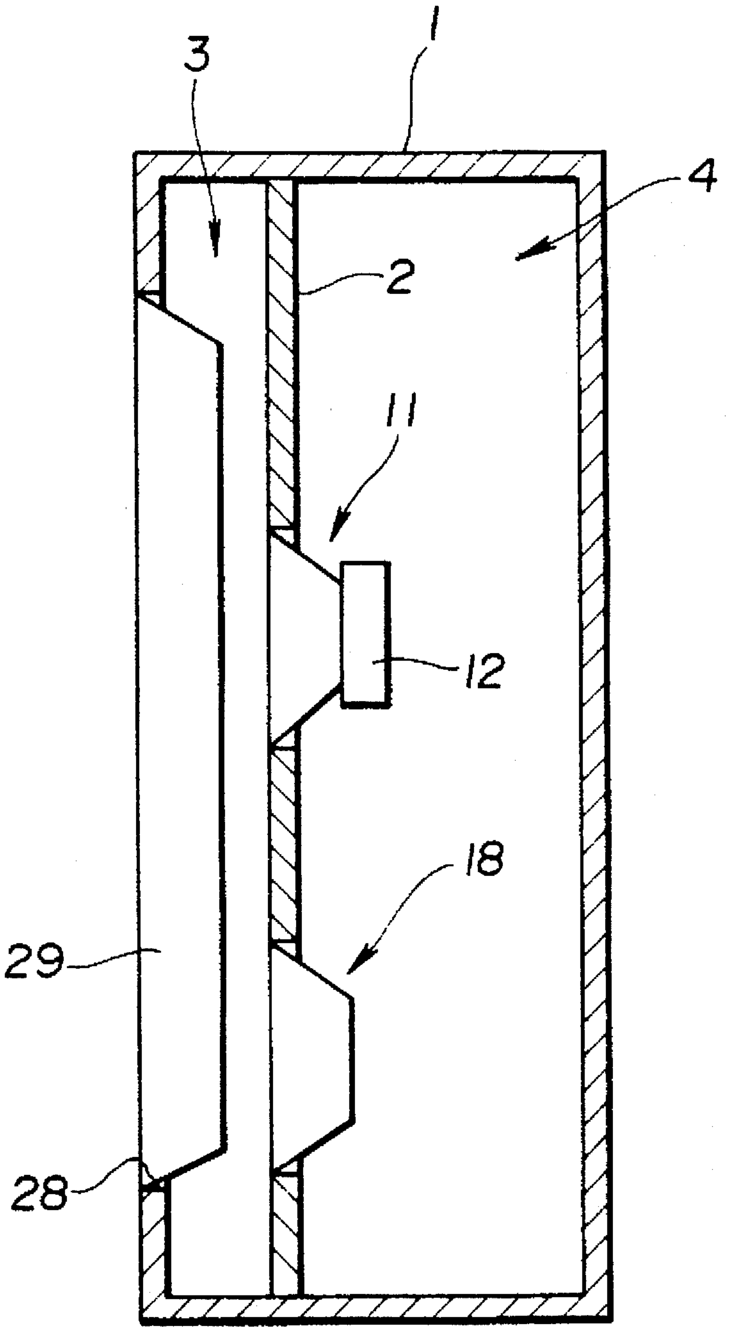
FIG. 13 is a longitudinal cross-sectional view, as viewed from the lateral side, showing a further embodiment of the speaker apparatus according to the present invention, having an external passive radiator in place of a duct.

With the speaker apparatus of the present invention, an external passive radiator 29 may be mounted on the front plate of the cabinet 1 in place of the duct 6, as shown in FIG. 13. Similarly to the internal passive radiator 18, the external passive radiator 29 includes a diaphragm supported by the frame for oscillation in the fore-and-aft direction. The external passive radiator 29 is supported with the direction of oscillation of the diaphragm being the fore-and-aft direction by having the frame supported at its outer rim portion mounted on the inner rim portion of the through-hole 28 formed in the front plate of the cabinet 1 for closing the through-hole 28. The diaphragm of the external passive radiator 29 is larger in area than the diaphragm of the internal passive radiator 18.

Figure 14:
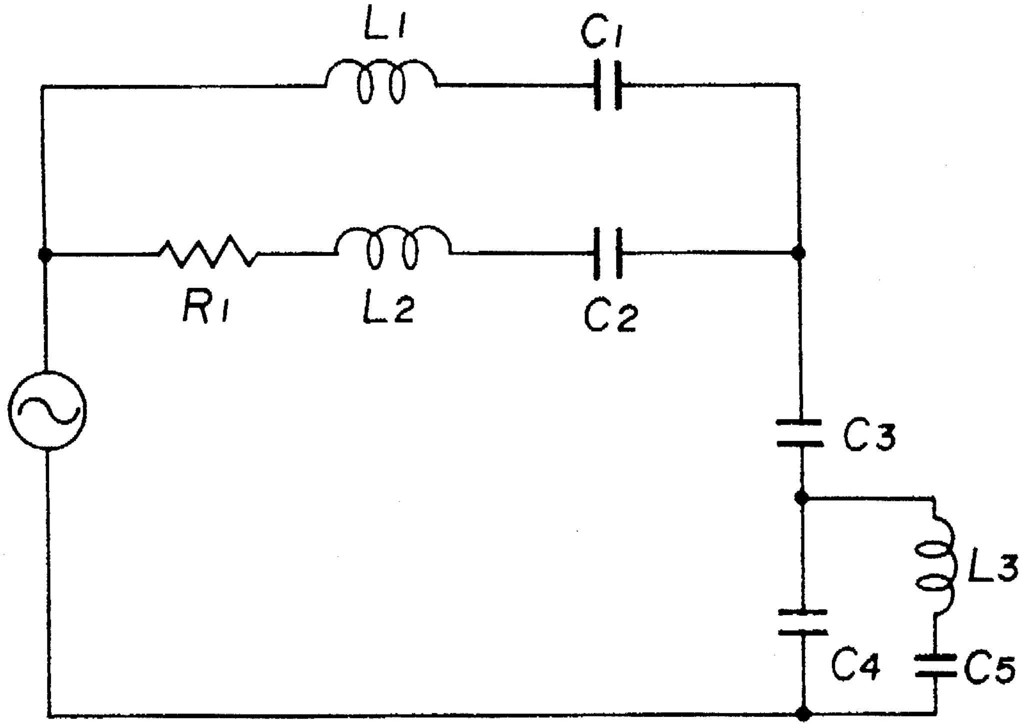
FIG. 14 is a circuit diagram showing an equivalent circuit of a vibrating system of the speaker apparatus shown in FIG. 13.

The vibrating system of the present speaker apparatus is shown by an equivalent circuit of FIG. 14, in which a resistor $R_1$, an inductance $L_2$ and compliances $C_2$, $C_3$ and $C_4$ are connected in series with a vibrating source to form a loop, and in which a series connection of an inductance $L_1$ and a compliance $C_1$ provided by the internal passive radiator 29 is connected in parallel with the resistor $R_1$, inductance $L_2$ and the compliance $C_2$, with series connection of an inductance $L_1$ and the compliance $C_1$ provided by the external passive radiator 29 being connected in parallel with the compliance C4.

With the present speaker apparatus, since the rear compartment 4 and the front compartment 3 are hermetically sealed and box-shaped, a satisfactory braking action occurs over the entire frequency range and excellent frequency characteristics and low distortion factor may be achieved.

Figure 15:
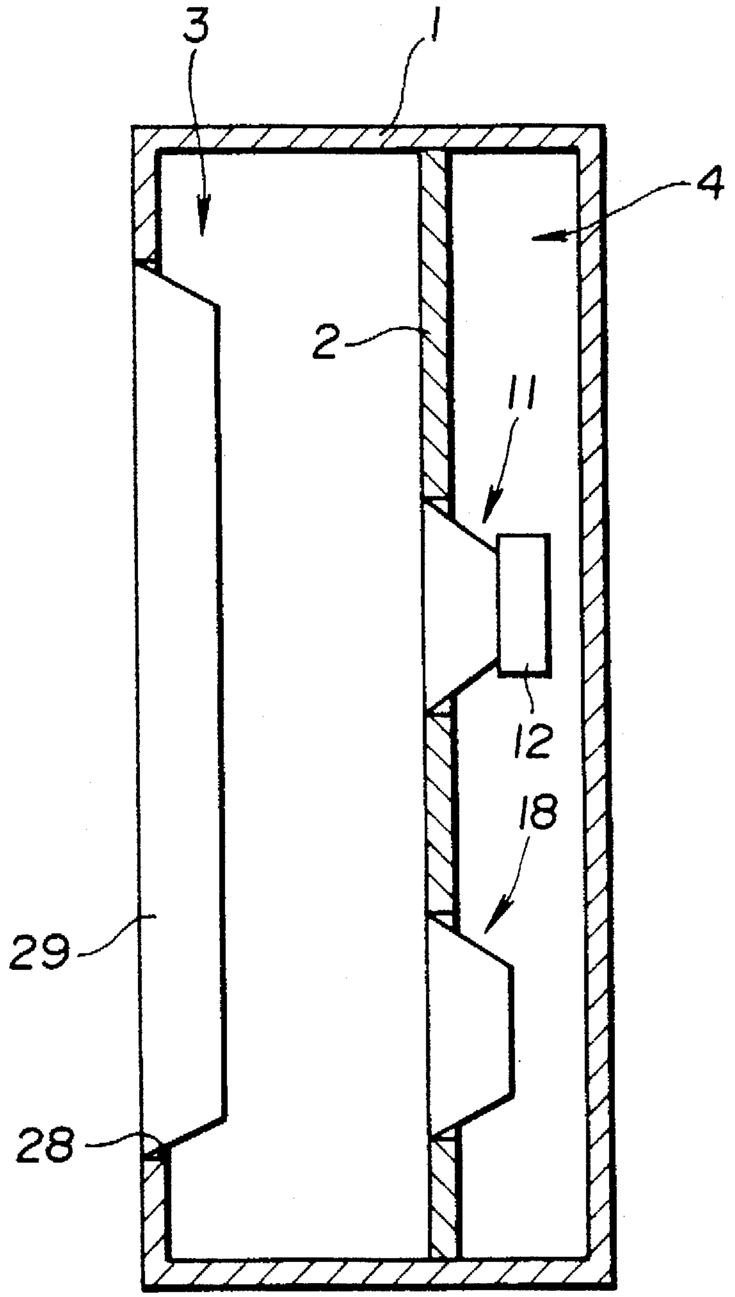
FIG. 15 is a longitudinal cross-sectional view, as viewed from the lateral side, showing a construction of a speaker apparatus having the capacity of the front compartment larger than that of the rear compartment, prepared for comparison of characteristics of the speaker apparatus shown in FIG. 13.

With the embodiment shown in FIG. 13, the capacity of the front compartment 3 is smaller than that of the rear compartment 4. As a comparative example, a speaker apparatus having a construction similar to that described above and having the capacity larger than the capacity of the rear compartment 4 as shown in FIG. 15 was fabricated for comparison of frequency characteristics.

Figure 16:
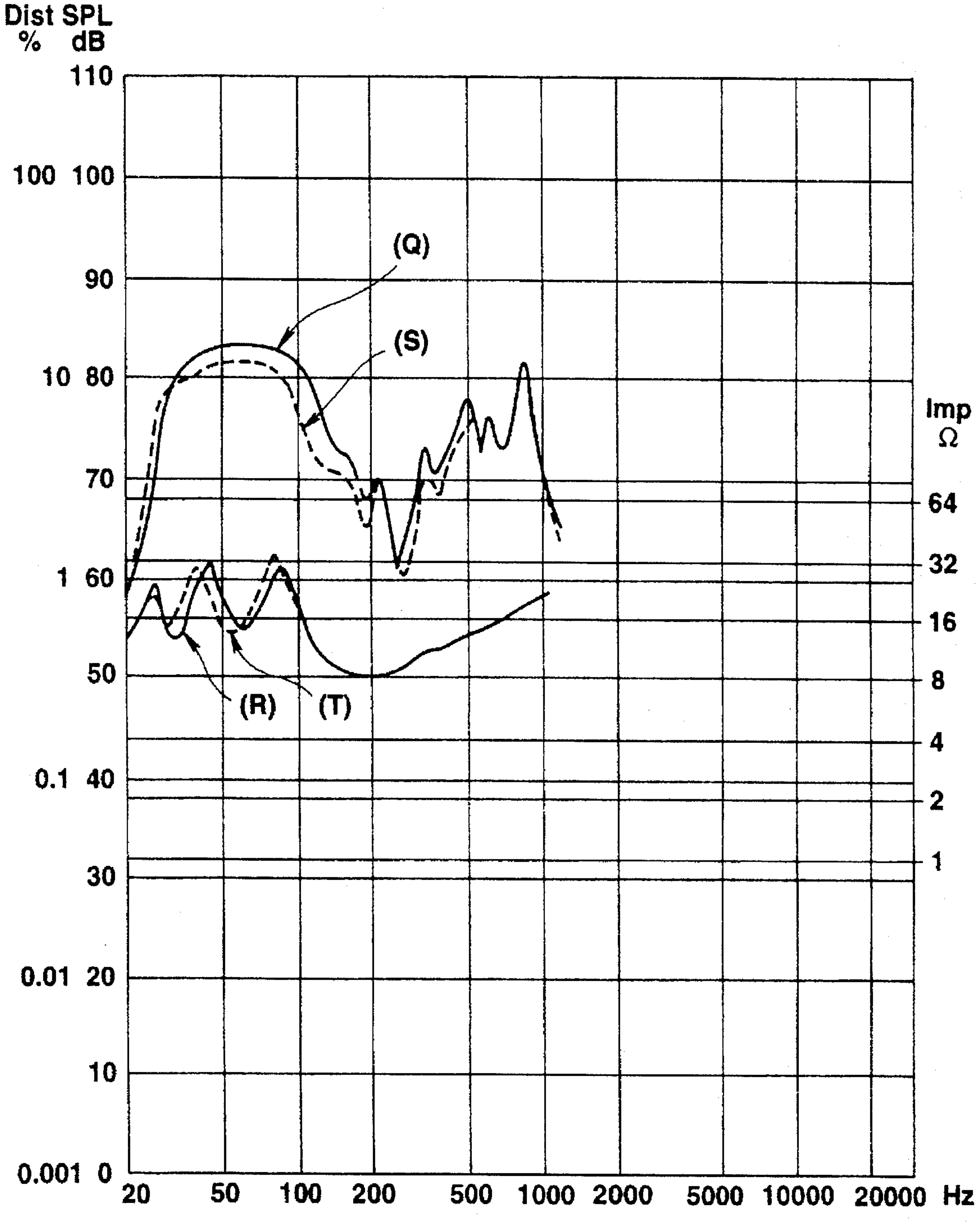
FIG. 16 is a graph for comparing the frequency characteristics Q and the distortion factor R by the second harmonics of the speaker apparatus shown in FIG. 13 with the frequency characteristics S and the distortion factor T by the second harmonics of the speaker apparatus shown in FIG. 15.

The frequency characteristics of the present embodiment are flatter over the broad frequency range than those of the previously described speaker apparatus as shown by a broken line S in FIG. 16.

With the above-described speaker apparatus according to the present invention, the speaker unit and the internal passive radiator, mounted on the partition plate dividing the cabinet into the front compartment and the rear compartment, render the rear compartment into an hermetically sealed box and constitute a resonance circuit, with the sound being radiated via a duct formed in the outer wall of the front compartment.

Consequently, with the present speaker apparatus, the hissing sound, which would be generated at both ends of an internal duct, such as duct 101 of the prior art speaker shown in FIG. 1, if such internal duct were provided, is not produced. Since the rear compartment is hermetically sealed, braking, or damping of the speaker unit, over the entire frequency range may be achieved for realizing improved frequency characteristics and low distortion characteristics. In addition, designing and fabrication are simplified as a result of use of the passive radiator in place of a duct.

In the above-described speaker apparatus, provided with the duct, the fixed playback sound source feeling may be increased by mounting the internal passive radiator below the speaker unit. In the preferred embodiment of the above-described speaker apparatus, provided with the duct, the duct is formed at a position facing the internal passive radiator. As a result, the playback sound may be improved by realizing flatter frequency characteristics.

While the present invention has been described herein with reference to specific embodiments, it will be appreciated and recognized by those skilled in the art that various modifications and changes can be made to the described embodiments without departing from the spirit and scope of the present invention as defined by the appended claims.

What is claimed is:

1. A speaker apparatus comprising a cabinet including a partition plate and having an internal volume divided by the partition plate into a front compartment and a rear compartment, a speaker unit mounted on the partition plate so that a sound radiating direction of the speaker unit is towards said front compartment, an internal passive radiator mounted on the partition plate and having a diaphragm area not smaller than a diaphragm area of the speaker unit; and a duct formed in the cabinet on an outer wall section of the front compartment extending in the same direction as the sound radiating direction of the speaker unit and being at a position facing the internal passive radiator.

2. The speaker apparatus as claimed in claim 1 wherein the internal passive radiator is mounted below the speaker unit relative to a top of the cabinet.

3. A loudspeaker apparatus comprising:

an enclosure including a partition plate and having an interior space divided by said partition plate into a front compartment and a rear compartment;

a speaker unit having a diaphragm and being mounted on said partition plate so that sound radiated therefrom is directed into said front compartment;

a passive radiator mounted on said partition plate and having a diaphragm area not smaller than a diaphragm area of said speaker unit;

a duct formed in said enclosure so as to allow air flow from said front compartment to an exterior of said enclosure, wherein said duct is substantially aligned with said passive radiator.

4. A loudspeaker device according to claim 3 wherein said partition plate is positioned within said enclosure so as to divide said interior space into a front compartment having a volume which is 1.5 times greater than a volume of said rear compartment.

5. A loudspeaker device according to claim 3 wherein said passive radiator has a diaphragm which is equal in size to a size of said diaphragm of said speaker unit.

6. A loudspeaker device according to claim 3 wherein said diaphragm is substantially circular in shape.

7. A loudspeaker device according to claim 3 wherein said diaphragm is elliptical in shape.

8. A loudspeaker device according to claim 3, wherein said passive radiator comprises a magnetic circuit having electrical leads extending to an exterior of enclosure; and a switch for selectively shorting or opening said magnetic circuit of said passive radiator.

9. A loudspeaker apparatus comprising:

an enclosure including a partition plate and having an interior space divided by said partition plate;

said partition plate being positioned within said enclosure so as to divide said interior space into a front compartment having a volume which is 1.5 times greater than a volume of said rear compartment;

a speaker unit having a circular diaphragm and being mounted on said partition plate so that sound radiated therefrom is directed into said front compartment;

a circular passive radiator mounted on said partition plate;

the diameter of said circular passive radiator is equal to the diameter of said circular diaphragm of said speaker unit;

a duct formed in said enclosure for allowing air to flow from said front compartment to an exterior of said enclosure, wherein said duct is substantially aligned with said passive radiator.

10. A loudspeaker apparatus comprising:

an enclosure having a plurality of exterior sides and an interior space defined by said exterior sides;

a partition plate dividing said interior space into a front compartment and a rear compartment;

said partition plate being positioned within said enclosure so as to divide said interior space into a front compartment having a volume of 15 liters and a rear compartment having a volume of 10 liters;

a speaker unit mounted on said partition plate so that sound radiated therefrom is directed into said front compartment;

said speaker unit including a circular diaphragm having a diameter of 16 cm;

a passive radiator mounted on said partition plate;

said passive radiator is circular in shape and has a diameter of 16 cm;

a tubular duct having a diameter of 80 mm and a length of 200 mm formed in said enclosure for allowing air to flow from said front compartment to an exterior of said enclosure; and said duct being substantially aligned with said passive radiator.

* * * * *